(12) United States Patent
Yoneda et al.

(10) Patent No.: US 7,604,751 B2
(45) Date of Patent: Oct. 20, 2009

(54) POLISHING LIQUID COMPOSITION

(75) Inventors: Yasuhiro Yoneda, Wakayama (JP);
Ryoichi Hashimoto, Wakayama (JP);
Toshiya Hagihara, Wakayama (JP)

(73) Assignee: Kao Corporation, Tokyo (JP)

( * ) Notice: Subject to any disclaimer, the term of this patent is extended or adjusted under 35 U.S.C. 154(b) by 142 days.

(21) Appl. No.: 11/434,074

(22) Filed: May 16, 2006

(65) Prior Publication Data

US 2006/0240672 A1    Oct. 26, 2006

Related U.S. Application Data

(62) Division of application No. 10/030,424, filed as application No. PCT/JP00/04571 on Jul. 7, 2000, now Pat. No. 7,118,685.

(30) Foreign Application Priority Data

Jul. 13, 1999   (JP)  ............................. 11-198263
Feb. 8, 2000    (JP)  ............................. 2000-030477

(51) Int. Cl.
H01L 21/302   (2006.01)
(52) U.S. Cl. ................... 216/88; 216/89; 252/79.1
(58) Field of Classification Search ............ 438/692; 252/79.1, 79.4; 216/88
See application file for complete search history.

(56) References Cited

U.S. PATENT DOCUMENTS

| 2,892,796 | A |   | 6/1959  | McCune              |         |
|-----------|---|---|---------|---------------------|---------|
| 4,141,850 | A |   | 2/1979  | Readio et al.       |         |
| 4,158,593 | A |   | 6/1979  | Allan et al.        |         |
| 5,209,820 | A | * | 5/1993  | Tytgat et al. ....  | 216/108 |
| 5,496,485 | A |   | 3/1996  | Maternaghan         |         |
| 5,741,765 | A | * | 4/1998  | Leach .............  | 510/123 |
| 5,783,489 | A | * | 7/1998  | Kaufman et al. ...  | 438/692 |
| 5,916,855 | A |   | 6/1999  | Avanzino et al.     |         |
| 5,958,288 | A | * | 9/1999  | Mueller et al. ...  | 252/186.1 |
| 6,063,306 | A | * | 5/2000  | Kaufman et al. ...  | 252/79.4 |
| 6,136,711 | A | * | 10/2000 | Grumbine et al. ..  | 438/692 |
| 6,383,240 | B1|   | 5/2002  | Nishimoto et al.    |         |
| 6,447,563 | B1| * | 9/2002  | Mahulikar .........  | 51/309  |

FOREIGN PATENT DOCUMENTS

| EP | 0 811 665      | 12/1997 |
| JP | 11 116942      | 4/1999  |
| JP | 11-116948 A    | 4/1999  |
| JP | 2000-252243 A  | 9/2000  |
| JP | 2001-187877    | 7/2001  |
| WO | WO 00/00561 A1 | 1/2000  |
| WO | WO 00/39844    | 7/2000  |

OTHER PUBLICATIONS

U.S. Appl. No. 60/105,366, filed Oct. 23, 1998, by Malulikar, priority filing for USPN 6,447,563, noted above.*
ChemIndustry.com; Synonyms for CAS Registry 6419-19-8 ; May 8, 2005.*
U.S. Appl. No. 11/544,694, filed Oct. 10, 2006, Yoneda, et al.
H. Duncan, et al., "Polishing composition for calcium fluoride—comprises aqueous iron (III) salt sollution containing alcohol", English Abstract of DD 249489A, May 26, 1986, 2 pp.

* cited by examiner

*Primary Examiner*—Keith D Hendricks
*Assistant Examiner*—Patricia A George
(74) *Attorney, Agent, or Firm*—Oblon, Spivak, McClelland, Maier & Neustadt, L.L.P.

(57) ABSTRACT

A polishing liquid composition is applicable as a means of forming embedded metal interconnections on a semiconductor substrate. In a surface to be polished comprising an insulating layer and a metal interconnection layer, the polishing liquid composition is capable of maintaining a polishing speed of the metal layer, of suppressing an etching speed, and of preventing dishing of the metal layer.

12 Claims, No Drawings

US 7,604,751 B2

POLISHING LIQUID COMPOSITION

TECHNICAL FIELD

The present invention relates to a polishing liquid composition for polishing a surface to be polished comprising an insulating layer and a metal layer. More specifically, the present invention relates to a polishing liquid composition which is applicable as a means of forming embedded metal interconnection on a semiconductor substrate, a process for polishing, and a process for manufacturing a semiconductor substrate.

BACKGROUND ART

In the process for manufacturing a semiconductor device, comprising the steps of forming interconnection-shaped recesses on a surface of the insulating film on a semiconductor substrate, sedimenting a metal film made of copper or the like on the insulating film having the recesses, and subjecting the metal film to polishing treatment by a polishing device and a polishing liquid, thereby allowing the metal layer to remain only in the recesses to form a metal interconnection layer, wherein Metal Chemical Mechanical Polishing (hereinafter simply referred to as "metal CMP") is employed for the process of polishing.

However, in the metal CMP, there arise grooves so-called dishing on the metal interconnection layer in the recesses of the insulating film, so that the cross-sectional area of the metal interconnection layer is reduced, thereby causing an increase in electric resistivity. This dishing is caused by more excessive polishing or etching of the surface of the metal interconnection layer than that of the insulating film surface by the polishing liquid composition. Especially copper, one of the main metal interconnection, has defects of being excessively etched by the polishing liquid composition, so that the dishing is likely to be caused.

Therefore, there has been desired a polishing liquid composition free from defects such as dishing in the metal layer during the formation of interconnection, with retaining an etching action for polishing the metal film on the insulating film.

As a conventional polishing liquid, for instance, Japanese Patent Laid-Open Nos. Hei 8-83780 and Hei 11-21546 each discloses a polishing liquid comprising benzotriazole or a derivative thereof as a protective film-forming agent for the metal surface in order to prevent the dishing. Since the formed protective film is rigid, when the metal layer is polished in the metal CMP, the polishing speed would become insufficient. In addition, Japanese Patent Laid-Open No. Hei 11-116942 discloses a composition for polishing, comprising a compound having 1 to 10 alcoholic hydroxyl groups, or a nitrogen-containing basic compound having 1 to 10 alcoholic hydroxyl groups. This composition for polishing has a purpose of reducing particles deposited on a wafer surface in final polishing of the semiconductor wafer, so that the problems to be solved are different.

In addition, Japanese Patent Laid-Open No. Hei 10-44047 discloses a polishing liquid comprising an aqueous medium, an abrasive, an oxidizing agent, and an organic acid. However, since the etching action is too strong, the prevention for dishing would be insufficient. Further, Japanese Patent Laid-Open No. Hei 11-195628 discloses a process for polishing in which a polishing liquid is used in combination with ammonium polyacrylate as a substance for suppressing oxidation and etching. However, in the metal CMP in which a metal layer made of copper or the like is polished, there arises surface roughening of the copper surface caused by ammonium polyacrylate.

An object of the present invention is to provide a polishing liquid composition capable of maintaining a polishing speed of a metal film, suppressing an etching speed, and having an excellent prevention effect such as dishing of the metal interconnection layer, in a surface to be polished comprising an insulating layer and a metal layer; a process for polishing; and a process for manufacturing a semiconductor substrate.

These objects and other objects of the present invention will be apparent from the following description.

DISCLOSURE OF INVENTION

Specifically, the present invention relates to:

[1] a polishing liquid composition for polishing a surface to be polished comprising an insulating layer and a metal layer, the polishing liquid composition comprising a compound having a structure in which each of two or more adjacent carbon atoms has a hydroxyl group in a molecule, and water (hereinafter also referred to "the polishing liquid composition 1-1");

[2] a polishing liquid composition for polishing a surface to be polished comprising an insulating layer and a metal layer, the polishing liquid composition comprising an aliphatic carboxylic acid having 7 to 24 carbon atoms and/or a salt thereof, an etching agent, and water (hereinafter also referred to "the polishing liquid composition 1-2");

[3] a polishing liquid composition for polishing a surface to be polished comprising an insulating layer and a metal layer, the polishing liquid composition comprising an amine compound represented by the following general formula (II):

wherein $R^3$ is a linear or branched alkyl group having 4 to 18 carbon atoms, a linear or branched alkenyl group having 4 to 18 carbon atoms, an aryl group having 6 to 18 carbon atoms, and an aralkyl group having 7 to 18 carbon atoms; each of $R^4$ and $R^5$, which may be identical or different, is hydrogen atom, a linear alkyl group having 1 to 8 carbon atoms or a branched alkyl group having 3 to 8 carbon atoms, or a group represented by $H-(OR^6)_z-$, wherein $R^6$ is a linear alkylene group having 1 to 3 carbon atoms, or a branched alkylene group having 3 carbon atoms; and Z is a number of 1 to 20, and/or a salt thereof, an etching agent, and water (hereinafter also referred to "the polishing liquid composition 1-3");

[4] the polishing liquid composition according to any one of items [1] to [3] above, further comprising an oxidizing agent (hereinafter also referred to "the polishing liquid composition 2");

[5] the polishing liquid composition according to any one of items [1] to [4] above, further comprising an abrasive (hereinafter also referred to "the polishing liquid composition 3");

[6] a process for polishing a semiconductor substrate, comprising polishing a surface to be polished comprising an insulating layer and a metal layer using the polishing liquid composition of any one of items [1] to [5], thereby smoothening the semiconductor substrate; and

[7] a process for manufacturing a semiconductor substrate comprising polishing a surface to be polished comprising an insulating layer and a metal layer using the polishing liquid composition of any one of items [1] to [5], thereby smoothening the semiconductor substrate.

BEST MODE FOR CARRYING OUT THE INVENTION

As mentioned above, the polishing liquid composition of the present invention is a polishing liquid composition for polishing a surface to be polished comprising an insulating layer and a metal layer, and has the following three embodiments.

Embodiment 1: A polishing liquid composition comprising a compound having a structure in which each of two or more adjacent carbon atoms has a hydroxyl group in a molecule, and water.

Embodiment 2: A polishing liquid composition comprising an aliphatic carboxylic acid having 7 to 24 carbon atoms and/or a salt thereof, an etching agent and water.

Embodiment 3: A polishing liquid composition comprising an amine compound represented by the following general formula (II):

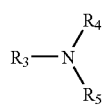
(II)

wherein $R^3$ is a linear or branched alkyl group having 4 to 18 carbon atoms, a linear or branched alkenyl group having 4 to 18 carbon atoms, an aryl group having 6 to 18 carbon atoms, and an aralkyl group having 7 to 18 carbon atoms; and each of $R^4$ and $R^5$, which may be identical or different, is hydrogen atom, a linear alkyl group having 1 to 8 carbon atoms or a branched alkyl group having 3 to 8 carbon atoms, or a group represented by $H-(OR^6)_z-$, wherein $R^6$ is a linear alkylene group having 1 to 3 carbon atoms, or a branched alkylene group having 3 carbon atoms; and Z is a number of 1 to 20, and/or a salt thereof, an etching agent, and water.

EMBODIMENT 1

In this embodiment, one of the great features resides in the use of a compound having a structure in which each of two or more adjacent carbon atoms has a hydroxyl group in a molecule (hereinafter simply referred to as "hydroxyl group-containing compound"). By the use of the polishing liquid composition comprising the hydroxyl group-containing compound, the polishing speed can be maintained, and excessive etching of a metal film in the metal layer can be prevented, so that there is exhibited an excellent effect that a polishing surface without defects such as dishing can be obtained.

In the hydroxyl group-containing compound, from the viewpoint of maintaining the polishing speed and suppressing dishing, the number of adjacent carbon atoms having a hydroxyl group in a molecule is 2 or more, preferably from 2 to 10, more preferably from 2 to 7, especially preferably from 2 to 4.

In addition, as the structure of the hydroxyl group-containing compound, it is particularly preferable that the structure in which each of two or more adjacent carbon atoms has a hydroxyl group is present in the terminal portion of a molecule.

Examples thereof include a compound represented by the formula (I):

wherein $R^1$ is a hydrocarbon group having 1 to 24 carbon atoms; X is a group represented by $(CH_2)_m$, wherein m is 0 or 1, oxygen atom, sulfur atom, COO group, OCO group, a group represented by $NR^2$ or $O(R^2O)P(O)O$, wherein $R^2$ is hydrogen atom or a hydrocarbon group having 1 to 24 carbon atoms; q is 0 or 1; and n is an integer of 1 to 4.

In the formula (I), the hydrocarbon group of $R^1$ may be either aliphatic or aromatic group, and the aliphatic group is preferable. The structure of the aliphatic group may be saturated or unsaturated, or linear or branched. From the viewpoint of suppressing dishing, a saturated structure is preferable, and a linear structure is preferable. In addition, the number of carbon atoms of the above hydrocarbon groups is preferably 1 or more, from the viewpoint of suppressing the dishing, and the number of carbon atoms is preferably 24 or less, from the viewpoint of the solubility of the compound represented by the formula (I) in water. The number of carbon atoms is more preferably from 1 to 18, still more preferably from 2 to 12. Each of m and q is preferably 1. The number of carbon atoms of $R^2$ is preferably 12 or less, more preferably 8 or less, still more preferably 4 or less, from the viewpoint of suppressing the dishing. Especially, $R^2$ is preferably hydrogen atom or methyl group. n is preferably 2 or less, more preferably 1, from the viewpoint of suppressing the dishing.

In addition, the hydroxyl group-containing compound may have various functional groups other than hydroxyl group in a molecule. From the viewpoints of maintaining the polishing speed and suppressing the dishing, those compounds which do not contain carboxyl group, sulfonate group, primary amino group or phenolic hydroxyl group are preferable.

The hydroxyl group-containing compound has a molecular weight of preferably 5000 or less, more preferably 1000 or less, especially preferably 500 or less, from the viewpoints of maintaining the polishing speed and suppressing the dishing.

The hydroxyl group-containing compound has an acid dissociation constant pKa in an aqueous solution of preferably 8 or more, more preferably 9 or more, especially preferably 10 or more, from the viewpoints of maintaining the polishing speed and suppressing the dishing. However, in a case where the hydroxyl group-containing compound has two or more dissociable functional groups in a molecule, pKa referred herein is a first dissociation constant. In addition, the solubility of the hydroxyl group-containing compound at a pH usable for a polishing liquid composition is such that the compound dissolves preferably at 0.5% by weight or more, more preferably at 1.0% by weight or more, in water at 25° C., from the viewpoint of formulating the hydroxyl group containing compound in an aqueous medium.

Concrete examples of these hydroxyl group-containing compounds include alkanediols such as 1,2-butanediol, 1,2-heptanediol, 1,2-hexanediol ("a" in Table 1 mentioned below), and 1,2-octanediol; alkanetriols such as 1,2,3-hexanetriol, 1,2,6-hexanetriol, and 1,2,3-heptanetriol; glyceryl ethers such as butyl glyceryl ether ("b" in Table 1 mentioned below), pentyl glyceryl ether, hexyl glyceryl ether, and octyl glyceryl ether; monoglycerides such as glyceryl monobutanoate, glyceryl monopentanoate, glyceryl monohexanoate, glyceryl monoheptanoate ("c" in Table 1 mentioned below), and glyceryl monooctanoate; partially esterified products prepared by carrying out esterification reaction of gluconic acid and an alcohol such as hexyl alcohol; compounds prepared by reacting glycidol with a monoalkylamine such as hexylamine or a dialkylamine such as dipropylamine ("d" in Table 1 mentioned below); diesters of tartaric acid such as diethyl tartrate, dibutyl tartrate, dipropyl tartrate ("e" in Table 1 mentioned below), and dihexyl tartrate; 1,2-cyclohexanediol, and the like. Among them, from the viewpoints of maintaining the polishing speed and suppressing the dishing, the alkanediols and the glyceryl ethers are preferable. These hydroxyl group-containing compounds may be used alone or in admixture of two or more kinds.

The amount of the hydroxyl group-containing compounds formulated is preferably from 0.01 to 30% by weight, more preferably from 0.05 to 5% by weight, still more preferably from 0.1 to 3% by weight, of the polishing liquid composition 1-1, from the viewpoints of maintaining the polishing speed and suppressing the dishing.

Water usable in this embodiment is used as a medium. Its amount formulated is preferably from 60 to 99.99% by weight, more preferably from 70 to 99.4% by weight, still more preferably from 80 to 99.0% by weight, of the polishing liquid composition 1-1, from the viewpoint of efficiently polishing the substrate to be polished.

The polishing liquid composition 1-1 of this embodiment having the composition described above has a pH of preferably from 2 to 11, more preferably from 2 to 7, still more preferably from 2 to 6, especially preferably 3 to 5, from the viewpoints of keeping a polishing speed at a practical level, suppressing the dishing, and removing fine scratch damages on the surface. In order to adjust the pH within the above ranges, an inorganic acid such as nitric acid or sulfuric acid, an organic acid, a basic substance such as potassium hydroxide, sodium hydroxide, ammonia, or an organic amine can be appropriately added, as occasion demands.

In addition, the polishing liquid composition 1-1 of this embodiment may further comprise an organic acid.

In this embodiment, since the organic acid is used, the organic acid forms a complex with or binds to various metals, especially copper, constituting the metal layer, so that the metal layer is made brittle, whereby exhibiting an effect that the removal of the metal layer is made easy during polishing.

In addition, especially, the organic acid can be used in combination with a compound having a structure in which each of two or more adjacent carbon atoms has a hydroxyl group in a molecule, whereby maintaining the polishing speed and preventing the dishing.

The organic acid is an organic compound showing acidic property.

These organic compounds showing acidic property include those having functional groups such as carboxyl group, phosphonic group, phosphinic group, sulfonic group, sulfinic group, phenol group, enol group, thiophenol group, imido group, oxime group, aromatic sulfamide groups, and primary and secondary nitro groups.

The organic acid usable in this embodiment has a molecular weight of preferably 1000 or less, more preferably 500 or less.

The organic acid having carboxyl group includes monocarboxylic acids having 1 to 24 carbon atoms, dicarboxylic acids, hydroxycarboxylic acids and aminocarboxylic acids are preferable, from the viewpoint of the solubility in water. The number of carbon atoms is more preferably 1 to 18 carbon atoms, still more preferably 1 to 12 carbon atoms, especially preferably 1 to 8 carbon atoms, most preferably 1 to 6 carbon atoms. Concrete examples thereof include monocarboxylic acids, such as formic acid, acetic acid, propionic acid, butyric acid, valerianic acid, caproic acid, and pyruvic acid; dicarboxylic acids such as oxalic acid, malonic acid, succinic acid, glutaric acid, and adipic acid; hydroxycarboxylic acids such as gluconic acid, tartaric acid, glycolic acid, lactic acid, citric acid, and malic acid; aminocarboxylic acid such as nitrilotriacetic acid. The organic acid having phosphonic group includes aminotri(methylenephosphonic acid), 1-hydroxyethylidene-1,1-diphosphonic acid, ethylenediaminetetra(methylenephosphonic acid), hexamethylenediaminetetra(methylenephosphonic acid), diethylenetriaminepenta(methylenephosphonic acid); the organic acid having phosphinic group includes ethyl phosphite, and the like; the organic acid having sulfonic group includes methanesulfonic acid, benzenesulfonic acid, p-toluenesulfonic acid, naphthalenesulfonic acid, and the like; the organic acid having sulfinic group includes benzenesulfinic acid, p-toluenesulfinic acid, and the like. Among them, the organic acids having carboxyl group are preferable. More concretely, monocarboxylic acids, dicarboxylic acids, hydroxycarboxylic acids and aminocarboxylic acids are preferable, and acetic acid, oxalic acid, succinic acid, glycolic acid, lactic acid, citric acid, malic acid, tartaric acid, gluconic acid and nitrilotriacetic acid are more preferable, and glycolic acid and gluconic acid are still more preferable. These organic acids may be used alone or in admixture of two or more kinds.

The organic acid is used in a state in which water is used as a medium in the polishing liquid composition 1-1. The amount of the organic acid formulated in the polishing liquid composition 1-1 can be widely selected for the purposes of securing the polishing speed at a practical level to remove the metal layer, and preventing excessive etching of the metal layer. The amount of the organic acid formulated is, for instance, preferably from 0.1 to 10% by weight, more preferably from 0.2 to 8% by weight, still more preferably from 0.3 to 5% by weight.

In addition, among the above organic acids, a compound capable of dissolving and etching a metal, especially copper in the copresence of an aqueous medium, and having an etching speed "a" of 3 Å/min or more, as obtained by the following etching test A can be used as an etching agent. Specifically, in the etching test A, first a copper ribbon (commercially available from K. K. Nirako; thickness: 0.10 mm, width: 6 mm) having a length of 100 mm is furnished, and the surface dirt or the like is wiped of with a sheet of paper. Thereafter, the copper ribbon is subjected to ultrasonic cleaning for one minute in a state of being immersed in normal hexane, and thereafter the surface is sufficiently degreased and dried. Subsequently, its metal test piece is coiled into a helical form so that an entire surface of the ribbon is immersed in the polishing liquid, to give a metal test piece before test. The weight before immersion is determined by accurate balance.

Next, the etching agent is diluted to give a 2% by weight aqueous solution thereof. Further, 100 g of the etching solution of which pH is adjusted to 8±0.5 with aqueous ammonia is furnished in a 150 cc beaker (K.K. Teraoka, 150 cc disposable cup), and the above metal test piece is immersed at 25° C. for 12 hours. During immersion, the etching solution is stirred with a magnetic stirrer, to an extent that the copper ribbon rotates along with the flow of the etching solution. After the test, the copper ribbon surface is sufficiently wiped off, and its weight is again determined by accurate balance, to give a weight after the test. The amount of reduced thickness of copper is calculated from the weight loss of the copper ribbon before and after the test, and the resulting amount is divided by the etching time period to determine an etching speed "a." From the viewpoint of obtaining a practical polishing speed, an etching agent having an etching speed "a" obtainable from the above etching test of 3 Å/min or more is preferable, more preferably 5 Å/min or more, still more preferably 10 Å/min or more. The etching speed "a" in this case may be an etching speed of two or more etching agents used in combination.

In addition, as the etching agent, an inorganic acid which is capable of dissolving and etching a metal, especially copper, in the copresence of an aqueous medium, and having an etching speed "a" obtainable from the above etching test A of 3 Å/min or more can be used.

Among the organic acids, from the viewpoint of having an appropriate etching speed, preferable etching agents include one or more compounds selected from the group consisting of the following A to D. Also, the following inorganic acids E are usable as an etching agent.

A: aliphatic organic acids having 6 or less carbon atoms and one to three carboxyl groups;
B: aromatic organic acids having 7 to 10 carbon atoms and one to four carboxyl groups;
C: organic acids having 6 or less carbon atoms and one to four phosphonic groups;
D: polyaminocarboxylic acids having in a molecule two or more structures represented by the formula (III):

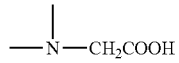

(III)

and
E: inorganic acids.

Concretely, the aliphatic organic acid of the group A having 6 or less carbon atoms and one to three carboxyl groups includes monocarboxylic acids, such as formic acid, acetic acid, and propionic acid; polycarboxylic acids, such as oxalic acid, malonic acid, succinic acid, glutaric acid, adipic acid, and tricarballylic acid; hydroxycarboxylic acids such as glycolic acid, lactic acid, 2-hydroxypropionic acid, malic acid, tartaric acid, citric acid, and gluconic acid; amino acids such as glycine, alanine, and aspartic acid; and the like. The aromatic organic acid of the group B having 7 to 10 carbon atoms and one to four carboxyl groups includes benzoic acid, phthalic acid, trimellitic acid, pyromellitic acid, mandelic acid, salicylic acid, and the like. The organic acid of the group C having 6 or less carbon atoms and one to four phosphonic groups includes phosphonic acids such as methylphosphonic acid and phenylphosphonic acid; phosphinic acids such as methylphosphinic acid and phenylphosphinic acid; phosphonic acid esters such as methyl ester of phosphonic acid; aminophosphonic acids such as aminotri(methylenephosphonic acid) and 1-hydroxyethylidene-1-diphosphonic acid; and the like. The polyaminocarboxylic acid of the group D having in a molecule two or more structures represented by the formula (III) includes ethylenediaminetetraacetic acid, nitrilotriacetic acid, diethylenediaminepentaacetic acid, triethylenetetraminehexaacetic acid, hydroxyethylethylenediaminetetraacetic acid, and the like. The inorganic acid of the group E includes hydrochloric acid, perchloric acid, sulfuric acid, nitric acid, phosphoric acid, phosphonic acid, phosphinic acid, and the like. Among them, from the viewpoint of the polishing speed, preferable are the polycarboxylic acids or hydroxycarboxylic acids belonging to the group A or B; aminophosphonic acids belonging to the group C; polyaminocarboxylic acids of the group D having in a molecule two or more structures represented by the formula (III); and hydrochloric acid, sulfuric acid, nitric acid, and phosphoric acid belonging to the group E. More preferable are oxalic acid, succinic acid, glycolic acid, lactic acid, citric acid, malic acid, gluconic acid, phthalic acid, aminotri(methylenephosphonic acid), 1-hydroxyethylidene-1-diphosphonic acid, ethylenediaminetetraacetic acid, hydrochloric acid, and sulfuric acid. These etching agents may be used alone or in admixture of two or more kinds. In this embodiment, glycolic acid and gluconic acid are especially preferable.

These etching agents, for instance, have the following etching speed "a": Glycolic acid, 60 Å/min; citric acid, 25 Å/min; phthalic acid, 50 Å/min; aminotri(methylenephosphonic acid), 10 Å/min; ethylenediaminetetraacetic acid, 30 Å/min; acetic acid, 70 Å/min, glycine, 40 Å/min; hydrochloric acid, 400 Å/min; and sulfuric acid, 100 Å/min.

When the etching agent usable in this embodiment is used in the preparation of a polishing liquid composition, with proviso that the composition does not comprise the hydroxyl group-containing compound, in which an oxidizing agent, abrasive grains, and the like are further copresent, it is preferable to adjust the kinds, contents, and the like, so that the etching liquid composition has an etching speed "b" obtainable from the following etching test B of 20 Å/min or more. The etching test B is carried out in the same procedures as in the etching test A, except that the copper ribbon is immersed in a polishing liquid composition comprising, as an etching solution of the etching test A, water, an abrasive and an etching agent, and, if necessary, an oxidizing agent, at room temperature (25° C.) for 2 hours, and that the pH is adjusted to 4.0±0.5. The etching speed obtained by the etching test B is referred to as "etching speed 'b'." From the viewpoint of obtaining a practical polishing speed, the etching speed "b" obtainable from the above etching test B is preferably 20 Å/min or more, more preferably 30 Å/min or more, still more preferably 50 Å/min or more. The etching speed "b" in this case may be an etching speed of a polishing liquid composition in which two or more etching agents are used in combination.

In this embodiment, since the etching agent is used, the etching agent forms a complex with or binds to various metals, especially copper, constituting the metal layer, so that the removal of the metals is made easy as water-soluble salts and/or chelated compounds, whereby exhibiting an effect that the polishing speed of the metal layer is increased during polishing.

The amount of the etching agent formulated in the polishing liquid composition 1-1 can be variously selected in order to secure the polishing speed at a practical level to remove the metal layer, and to prevent excessive etching of the metal layer. The amount of the etching agent formulated is preferably from 0.1 to 10% by weight, more preferably from 0.2 to 8% by weight, still more preferably from 0.3 to 5% by weight, of the polishing liquid composition 1-1.

EMBODIMENT 2

In this embodiment, one of the largest features resides in that the above aliphatic carboxylic acid having 7 to 24 carbon atoms and/or a salt thereof and the etching agent are used in combination. Since the aliphatic carboxylic acid having 7 to 24 carbon atoms and/or a salt thereof has an action of lowering the etching speed, the polishing speed at a practical level can be maintained and excessive etching of the metal film in the metal layer can be prevented by the use of a polishing liquid composition comprising these compounds and the etching agent. Therefore, there is exhibited an excellent effect that the polishing surface without defects such as dishing can be obtained.

From the viewpoints of maintaining the polishing speed and suppressing the dishing, the aliphatic carboxylic acid and/or a salt thereof has 7 to 24 carbon atoms. Further, from the viewpoints of keeping the solubility in the polishing liquid, the low-foamability, and the polishing speed at practical levels, and suppressing the dishing, these compounds have preferably from 7 to 20 carbon atoms, more preferably from 7 to 16 carbon atoms, still more preferably from 7 to 12 carbon atoms, especially preferably from 7 to 10 carbon atoms.

In addition, the hydrocarbon group of the aliphatic carboxylic acid and/or a salt thereof may be saturated or unsaturated, or linear or branched.

In addition, the salts of the aliphatic carboxylic acids may be any of ammonium salts, salts of organic amines, and alkali metal salts. From the viewpoint of preventing staining of the semiconductors, ammonium salts, and salts of organic amines such as salts of monoethanolamine, salts of diethanolamine, salts of triethanolamine, and salts of triethylamine.

Concrete examples of these aliphatic carboxylic acids and salts thereof include linear, saturated aliphatic carboxylic acids such as heptanoic acid, octanoic acid, nonanoic acid, decanoic acid, lauric acid, myristic acid, palmitic acid, stearic acid, and eicosanoic acid; linear, unsaturated aliphatic carboxylic acids such as heptenoic acid, octenoic acid, decenoic acid, dodecenoic, and oleic acid; branched, saturated aliphatic carboxylic acids such as 2-methylhexanoic acid, 2-ethylhexanoic acid, 3,5-dimethylhexanoic acid, 3,5,5-trimethylhexanoic acid, and isodecanoic acid; and ammonium salts, salts of organic amines, alkali metal salts of these aliphatic carboxylic acids, and the like. Among them, from the viewpoints of the polishing speed and the suppression of the dishing, the linear or branched, saturated aliphatic carboxylic acids and ammonium salts thereof are preferable, and from the viewpoint of the solubility in the polishing liquid and the low foamability, heptanoic acid or ammonium salt thereof, octanoic acid or ammonium salt thereof, nonanoic acid or ammonium salt thereof, and decanoic acid or ammonium salt thereof are especially preferable. These aliphatic carboxylic acids having 7 to 24 carbon atoms and salts thereof may be used alone or in admixture of two or more kinds.

The amount of the aliphatic carboxylic acid and a salt thereof formulated is preferably from 0.01 to 30% by weight, more preferably from 0.02 to 10% by weight, still more preferably from 0.03 to 5% by weight, of the polishing liquid composition 1-2, from the viewpoint of maintaining the polishing speed, and suppressing the dishing.

The etching agent usable in this embodiment is capable of dissolving and etching a metal, especially copper, in the copresence of an aqueous medium, and is a compound having an etching speed "a") of 3 Å/min or more, as obtained by the etching test A described in Embodiment 1. From the viewpoint of obtaining a practical polishing speed, an etching agent having an etching speed "a" obtainable from the above etching test A of 3 Å/min or more is preferable, more preferably 5 Å/min or more, still more preferably 10 Å/min or more. The etching speed "a" in this case may be an etching speed of two or more etching agents used in combination.

Preferable etching agents include the same ones as those in Embodiment 1 mentioned above. These etching agents may be used alone or in admixture of two or more kinds. In this embodiment, glycolic acid, citric acid, and aminotri(methylenephosphonic acid) are especially preferable. Incidentally, the etching speed "a" of the aliphatic carboxylic acid having 7 to 24 carbon atoms is 2 Å/min or less, and as compared to the etching agent, the etching strength is none or almost not found.

When the etching agent usable in this embodiment is used in the preparation of a polishing liquid composition, with proviso that the composition does not comprise the aliphatic carboxylic acid having 7 to 24 carbon atoms and/or a salt thereof, in which an oxidizing agent, abrasive grains, and the like are further copresent, it is preferable to adjust the kinds, contents, and the like, so that the polishing liquid composition has an etching speed "c" obtainable from the following etching test C of 20 Å/min or more. The etching test C is carried out in the same procedures as in the etching test A, except that the copper ribbon is immersed in a polishing liquid composition comprising, as an etching solution of the etching test A, water, an abrasive and an etching agent, and, if necessary, an oxidizing agent, at room temperature (25° C.) for 2 hours. The etching speed obtained by the etching test C is referred to as "etching speed 'c'." From the viewpoint of obtaining a practical polishing speed, the etching speed "c" obtainable from the above etching test C is preferably 20 Å/min or more, more preferably 30 Å/min or more, still more preferably 50 Å/min or more. The etching speed "c" in this case may be an etching speed of a polishing liquid composition in which two or more etching agents are used in combination.

In this embodiment, since the etching agent is used, the etching agent forms a complex with or binds to various metals, especially copper, constituting the metal layer, so that the removal of the metals is made easy as water-soluble salts and/or chelated compounds, whereby exhibiting an effect that the polishing speed of the metal layer is increased during polishing.

The amount of the etching agent formulated in the polishing liquid composition 1-2 can be variously selected in order to secure the polishing speed at a practical level to remove the metal layer, and to prevent excessive etching of the metal layer. The amount of the etching agent formulated is preferably from 0.1 to 10% by weight, more preferably from 0.2 to 8% by weight, still more preferably from 0.3 to 5% by weight, of the polishing liquid composition 1-2.

Water usable in this embodiment is used as a medium. The amount of water formulated is preferably from 60 to 99.89% by weight, more preferably from 70 to 99.4% by weight, still more preferably from 80 to 99% by weight, of the polishing liquid composition 1-2, from the viewpoint of efficiently polishing the substrate to be polished.

The polishing liquid composition 1-2 of this embodiment having the composition described above has a pH of preferably 10 or less, more preferably from 2 to 9.5, still more preferably from 4 to 9, especially preferably from 7 to 9, from the viewpoints of keeping a polishing speed at a practical level, suppressing the dishing, and removing fine scratch damages on the surface. In order to adjust the pH within the above ranges, an inorganic acid such as nitric acid or sulfuric acid, an organic acid; a basic substance such as potassium hydroxide, sodium hydroxide, ammonia, or an organic amine can be appropriately added, as occasion demands.

EMBODIMENT 3

In this embodiment, one of the largest features resides in that the above amine compound represented by the general formula (II) and/or a salt thereof and the etching agent are used in combination. The polishing speed at a practical level can be maintained and excessive etching of the metal film of the metal layer can be prevented by the use of a polishing liquid composition comprising the amine compound and/or a salt thereof, and the etching agent. Therefore, there is exhibited an excellent effect that the polishing surface without defects such as dishing can be obtained.

The above amine compound represented by the general formula (II) and/or a salt thereof usable in this embodiment is preferable, from the viewpoints of maintaining the polishing speed and suppressing the dishing. Further, from the viewpoints of keeping the low foam ability and the polishing speed at practical levels and suppressing the dishing, in the formula, $R^3$ is preferably a linear or branched, alkyl or alkenyl group having 5 to 14 carbon atoms, more preferably a linear or branched, alkyl or alkenyl group having 6 to 12 carbon atoms, still more preferably a linear or branched, alkyl or alkenyl group having 7 to 10 carbon atoms. Each of $R^4$ and $R^5$ is preferably hydrogen, a linear alkyl group having 1 or 2 carbon atoms, a group represented by H—$(OR^6)_z$—, wherein $R^6$ is an alkylene group having 2 carbon atoms and Z is a number from 1 to 4, and more preferably hydrogen atom, methyl group and hydroxyethyl group.

In addition, the salt of the amine compound may be either a salt with an inorganic acid or a salt with an organic acid, and those which are a salt with an inorganic acid or organic acid which is usable as an etching agent are preferable. Further, from the viewpoint of preventing staining of the semiconductor, salts of organic acids are more preferable among the etching agents.

Concrete examples of these amine compounds and salts thereof include linear monoalkylamines such as butylamine, pentylamine, hexylamine, heptylamine, octylamine, nonylamine, decylamine, laurylamine, myristylamine, and stearylamine; linear monoalkenylamines such as oleylamine; branched monoalkylamines such as 2-ethylhexylamine; dialkylamines such as dihexylamine and dioctylamine; trialkylamines such as dimethyloctylamine, dimethyldecylamine, and dimethyldodecylamine; alkylalkanolamines such as octyldiethanolamine, decyldiethanolamine, and dodecyldiethanolamine; and carboxylates, phosphates, hydrochlorides, sulfates, nitrates, and the like of these amine compounds. Among them, from the viewpoints of maintaining the polishing speed and suppressing the dishing, monoalkylamines, monoalkyldimethylamines, and monoalkyldiethanolamines, each of which is linear or branched, and carboxylates thereof are preferable. Further, from the viewpoint of the low foamability, more preferable are heptylamine, octylamine, nonylamine, dimethyloctylamine, dimethyldecylamine, dimethyldodecylamine octyldiethanolamine, decyldiethanolamine, and carboxylates thereof. These amine compounds and salts thereof may be used alone or in admixture of two or more kinds.

The amount of the amine compound and a salt thereof formulated is preferably from 0.01 to 30% by weight, more preferably from 0.02 to 10% by weight, still more preferably from 0.03 to 5% by weight, of the polishing liquid composition 1-3, from the viewpoint of maintaining the polishing speed, and suppressing the dishing.

The etching agent usable in this embodiment is capable of dissolving and etching a metal, especially copper, in the copresence of an aqueous medium, and is a compound having an etching speed "a" of 3 Å/min or more, as obtained by the etching test A described in Embodiment 1. From the viewpoint of obtaining a practical polishing speed, an etching agent having an etching speed "a" obtainable from the above etching test A of 3 Å/min or more is preferable, more preferably 5 Å/min or more, still more preferably 10 Å/min or more. The etching speed "a" in this case may be an etching speed of two or more etching agents used in combination.

Preferable etching agents include the same ones as those in Embodiment 1 mentioned above. These etching agents may be used alone or in admixture of two or more kinds. In this embodiment, glycolic acid, citric acid, and aminotri(methylenephosphonic acid) are especially preferable.

When the etching agent usable in this embodiment is used in the preparation of a polishing liquid composition, with proviso that the composition does not comprise the above amine compound or a salt thereof, in which an oxidizing agent, abrasive grains, and the like are further copresent, it is preferable to adjust the kinds, contents, and the like, so that the polishing liquid composition has an etching speed "c" obtainable from the etching test C described in Embodiment 2 of 20 Å/min or more. From the viewpoint of obtaining a practical polishing speed, the etching speed "c" obtainable from the above etching test C is preferably 20 Å/min or more, more preferably 30 Å/min or more, still more preferably 50 Å/min or more. The etching speed "c" in this case may be an etching speed of a polishing liquid composition in which two or more etching agents are used in combination.

In this embodiment, since the etching agent is used, the etching agent forms a complex with or binds to various metals, especially copper, constituting the metal layer, so that the removal of the metals is made easy as water-soluble salts and/or chelated compounds, whereby exhibiting an effect that the polishing speed of the metal layer is increased during polishing.

The amount of the etching agent formulated in the polishing liquid composition 1-3 can be variously selected in order to secure the polishing speed at a practical level to remove the metal layer, and to prevent excessive etching of the metal layer. The amount of the etching agent formulated is preferably from 0.1 to 10% by weight, more preferably from 0.2 to 8% by weight, still more preferably from 0.3 to 5% by weight, of the polishing liquid composition 1-3.

Water usable in this embodiment is used as a medium. The amount thereof is preferably from 60 to 99.89% by weight, more preferably from 70 to 99.4% by weight, still more preferably from 80 to 99% by weight, of the polishing liquid composition 1-3, from the viewpoint of efficiently polishing the substrate to be polished.

The polishing liquid composition 1-3 of this embodiment having the composition described above has a pH of preferably 10 or less, more preferably from 2 to 9.5, still more preferably from 4 to 9, especially preferably from 5 to 9, from the viewpoints of keeping a polishing speed at a practical level, suppressing the dishing, and removing fine scratch damages on the surface. In order to adjust the pH within the above ranges, an inorganic acid such as nitric acid or sulfuric acid, an organic acid, a basic substance such as potassium hydroxide, sodium hydroxide, ammonia, or an organic amine can be appropriately added, as occasion demands.

The polishing liquid composition 2 comprises one of the polishing liquid compositions 1-1 to 1-3 (hereinafter collectively referred to as "the polishing liquid composition 1"), and further comprising an oxidizing agent. The oxidizing agent usable in the present invention refers to those oxidizing a metal. In the present invention, it is thought that the metal layer is oxidized by the use of the oxidizing agent, whereby an effect of accelerating the mechanical polishing effect of the metal layer is exhibited.

The oxidizing agent includes, peroxides; permanganic acid or salts thereof, chromic acid or salts thereof, nitric acid or salts thereof; peroxo acid or salts thereof; oxyacid or salts thereof; metal salts; sulfuric acid, and the like.

As concrete examples thereof, the peroxide includes hydrogen peroxide, sodium peroxide, barium peroxide, and the like; the permanganic acid or salts thereof include potassium permanganate, and the like; chromic acid or salts thereof include metal salts of chromic acid, metal salts of dichromic acid, and the like; the nitrates include iron (III) nitrate, ammonium nitrate, and the like; the peroxo acid or salts thereof include peroxodisulfuric acid, ammonium peroxodisulfate, metal salts of peroxodisulfuric acid, peroxophosphoric acid, peroxosulfuric acid, sodium peroxoborate, performic acid, peracetic acid, perbenzoic acid, perphthalic acid, and the like; the oxyacid or salts thereof include hypochlorous acid, hypobromous acid, hypoiodous acid, chloric acid, bromic acid, iodic acid, perchloric acid, sodium hypochlorite, calcium hypochlorite, and the like; metal salts include iron (III) chloride, iron (III) sulfate, iron (III) citrate, ammonium iron (III) sulfate, and the like. Among the oxidizing agents, hydrogen peroxide, iron (III) nitrate, peracetic acid, ammonium peroxodisulfate, iron (III) sulfate and ammonium iron (III) sulfate are preferable, and especially hydrogen peroxide is preferable. These oxidizing agents may be used alone or in admixture of two or more kinds.

The oxidizing agent is used in a state in which water is used as a medium in the polishing liquid composition 2. The amount of the oxidizing agent formulated is preferably from 0.1 to 60% by weight, more preferably from 0.2 to 50% by weight, still more preferably from 0.3 to 30% by weight, especially preferably from 0.3 to 10% by weight, of the polishing liquid composition 2, from the viewpoint of obtaining the polishing speed at a practical level by rapid oxidation of the metal layer.

In addition, when the polishing liquid composition 2 is prepared from the polishing liquid composition 1-1, the amount of the hydroxyl group-containing compound formulated is preferably from 0.01 to 30% by weight, more preferably from 0.05 to 5% by weight, still more preferably from 0.1 to 3% by weight, of the polishing liquid composition 2. The amount of water formulated is preferably from 40 to 99.89% by weight, more preferably from 70 to 99.4% by weight, still more preferably from 80 to 99% by weight, of the polishing liquid composition 2. The pH of the polishing liquid composition 2 having the above composition, which is the same as the polishing liquid composition 1-1, is preferably from 2 to 11, more preferably from 2 to 7, still more preferably 2 to 6, especially preferably from 3 to 5, from the viewpoints of keeping the polishing speed at a practical level, suppressing the dishing, and removing the fine scratch damages on the surface. In order to adjust the pH to the above-specified range, there may be added at an appropriate timing an inorganic acid such as nitric acid or sulfuric acid, an organic acid, or a basic substance such as potassium hydroxide, sodium hydroxide, ammonia, or an organic amine.

In addition, when the polishing liquid composition 2 is prepared from the polishing liquid composition 1-2, the amount of the aliphatic carboxylic acid having 7 to 24 carbon atoms and/or salts thereof formulated is preferably from 0.01 to 30% by weight, more preferably from 0.02 to 10% by weight, still more preferably from 0.03 to 5% by weight, of the polishing liquid composition 2. The amount of the etching agent formulated is preferably from 0.1 to 10% by weight, more preferably from 0.2 to 8% by weight, still more preferably from 0.3 to 5% by weight, of the polishing liquid composition 2. The amount of water formulated is preferably from 39.89 to 99.79% by weight, more preferably from 70 to 99.4% by weight, still more preferably from 80 to 99% by weight, of the polishing liquid composition 2. The pH of the polishing liquid composition 2 having the above composition, which is the same as the polishing liquid composition 1-2, is preferably 10 or less, more preferably from 2 to 9.5, still more preferably 4 to 9, especially preferably from 7 to 9, from the viewpoints of keeping the polishing speed at a practical level, suppressing the dishing, and removing the fine scratch damages on the surface.

In addition, when the polishing liquid composition 2 is prepared from the polishing liquid composition 1-3, the amount of the amine compound and/or salts thereof formulated is preferably from 0.01 to 30% by weight, more preferably from 0.02 to $_{10}$% by weight, still more preferably from 0.03 to 5% by weight, of the polishing liquid composition 2. The amount of the etching agent formulated is preferably from 0.1 to 10% by weight, more preferably from 0.2 to 8% by weight, still more preferably from 0.3 to 5% by weight, of the polishing liquid composition 2. The amount of water formulated is preferably from 39.89 to 99.79% by weight, more preferably from 70 to 99.4% by weight, still more preferably from 80 to 99% by weight, of the polishing liquid composition 2. The pH of the polishing liquid composition 2 having the above composition, which is the same as the polishing liquid composition 1-3, is preferably 10 or less, more preferably from 2 to 9.5, still more preferably 4 to 9, especially preferably from 5 to 9, from the viewpoints of keeping the polishing speed at a practical level, suppressing the dishing, and removing the fine scratch damages on the surface.

The polishing liquid compositions 1 and 2 of the present invention are effective for polishing processes using a fixed grinding wheel, a polishing pad in which abrasive grains are fixed to the pad, and the like. For instance, by the use of the polishing liquid compositions 1 and 2 of the present invention during polishing in the polishing process using the fixed grinding wheel, the polishing speed can be maintained, and the dishing of the metal layer can be suppressed.

The polishing liquid composition 3 of the present invention is one further comprising an abrasive to a polishing liquid composition 1 or 2, which is usable for a polishing process by loose abrasives.

As the abrasive, abrasives generally employed for polishing can be used. The abrasive includes, for instance, metals, carbides of metals or metalloids, nitrides of metals or metalloids, oxides of metals or metalloids, borides of metals or metalloids, diamond, and the like. The metals or metalloids include those elements belonging to the Groups 3A, 4A, 5A, 3B, 4B, 5B, 6B, 7B or 8B of the Periodic Table. Examples thereof include silicon dioxide, aluminum oxide, cerium oxide, titanium oxide, zirconium oxide, silicon nitride, manganese dioxide, silicon carbide, zinc oxide, diamond, and magnesium oxide. Among them, silicon dioxide, aluminum oxide and cerium oxide are preferable. As concrete examples thereof, the silicon dioxide includes colloidal silica particles, fumed silica particles, surface-modified silica particles, and the like; the aluminum oxide includes α-alumina particles, γ-alumina particles, δ-alumina particles, θ-alumina particles, η-alumina particles, amorphous alumina particles, and other fumed alumina or colloidal alumina prepared by different process; the cerium oxide includes ones having oxidation state of 3 or 4, of which crystal system is hexagonal system, isometric system, or face-centered cubic system, and the like. The silicon dioxide is especially preferable. These abrasives may be used alone or in admixture of two or more kinds.

The abrasive has a primary average particle size of preferably from 5 to 1000 nm, more preferably from 10 to 500 nm, still more preferably from 20 to 300 nm, especially preferably from 50 to 200 nm, most preferably from 50 to 100 nm. The lower limit of the average particle size is preferably 5 nm or more, from the viewpoint of maintaining a given polishing speed, and the upper limit thereof is preferably 1000 nm or less, form the viewpoint of preventing the generation of scratches on the surface of the substrate to be polished.

Especially when the silicon dioxide is used as an abrasive, the silicon dioxide has a primary average particle size of 5 nm or more, preferably 10 nm or more, more preferably 20 nm or more, from the viewpoint of improving the polishing speed.

Incidentally, the primary average particle size of the abrasive is determined by adding 0.1 g of the abrasive to 100 g of a 0.1% aqueous solution of sodium polystyrenesulfonate, thereafter applying ultrasonic waves, to disperse the abrasive, and measuring image analysis of the dispersion by observing with a transmission electron microscope.

When the polishing liquid composition 3 is used when forming interconnection of a semiconductor device, especially preferably usable abrasives are silica particles having purity of preferably 98% by weight or more, more preferably 99% by weight or more, especially preferably 99.9% by weight or more. The abrasive includes fumed silica prepared by subjecting a volatile silicon compound such as silicon tetrachloride to high-temperature hydrolysis in oxyhydrogen flame; or colloidal silica obtained by a process in which an alkali silicate or ethyl silicate is used as a starting material.

Incidentally, the purity of the above abrasive is obtained as follows. Specifically, the purity can be determined by dissolving 1 to 3 g of an abrasive in an acid or an aqueous alkali, and quantifying silicon ions by ICP (plasma emission analysis).

The abrasive is used in a so-called "slurry state" using water as a medium in the polishing liquid composition 3. The amount of the abrasive formulated in the polishing liquid composition 3 can be variously selected depending upon the viscosity of the polishing liquid composition and the required quality of the substrate to be polished, and the like. The amount of the abrasive formulated is preferably from 0.01 to 30% by weight, more preferably from 0.02 to 20% by weight, still more preferably from 0.1 to 20% by weight, especially preferably from 1.0 to 10% by weight, of the polishing liquid composition 3.

In addition, when the polishing liquid composition 3 is prepared from the polishing liquid composition 1-1 (hereinafter referred to as "polishing liquid composition 3-1"), the amount of the hydroxyl-group containing compound formulated is preferably from 0.01 to 30% by weight, more preferably from 0.05 to 5% by weight, still more preferably from 0.1 to 3% by weight, of the polishing liquid composition 3-1, from the viewpoints of maintaining the polishing speed and suppressing the dishing.

The amount of the organic acid formulated in the polishing liquid composition 3-1 can be variously selected in order to secure a polishing speed at a practical level for removal of the metal layer, and to prevent excessive etching of the metal layer. The amount is, for instance, preferably from 0.1 to 10% by weight, more preferably from 0.2 to 8% by weight, still more preferably from 0.3 to 5% by weight, of the polishing liquid composition 3-1.

The amount of the oxidizing agent formulated is preferably from 0.1 to 60% by weight, more preferably from 0.2 to 50% by weight, still more preferably from 0.3 to 30% by weight, of the polishing liquid composition 3-1, from the viewpoint of obtaining a polishing speed at a practical level by rapid oxidation of the metal layer.

The amount of water formulated is preferably from 40 to 99.98% by weight, more preferably from 60 to 99.4% by weight, still more preferably from 75 to 99% by weight, of the polishing liquid composition 3-1. The pH of the polishing liquid composition 3-1 having the above composition, which is the same as the polishing liquid composition 1-1, is preferably from 2 to 11, more preferably from 2 to 7, still more preferably 2 to 6, especially preferably from 3 to 5, from the viewpoints of keeping the polishing speed at a practical level, suppressing the dishing, and removing the fine scratch damages on the surface.

In addition, when the polishing liquid composition 3 is prepared from the polishing liquid composition 1-2 (hereinafter referred to as "polishing liquid composition 3-2"), the amount of the aliphatic carboxylic acid having 7 to 24 carbon atoms and/or salts thereof formulated is preferably from 0.01 to 30% by weight, more preferably from 0.02 to 10% by weight, still more preferably from 0.03 to 5% by weight, of the polishing liquid composition 3-2, from the viewpoints of maintaining the polishing speed and suppressing the dishing.

The amount of the etching agent formulated in the polishing liquid composition 3-2 can be variously selected in order to secure a polishing speed at a practical level for removal of the metal layer, and to prevent excessive etching of the metal layer. The amount formulated is, for instance, preferably from 0.1 to 10% by weight, more preferably from 0.2 to 8% by weight, still more preferably from 0.3 to 5% by weight, of the polishing liquid composition 3-2.

The amount of the oxidizing agent formulated is preferably from 0.1 to 60% by weight, more preferably from 0.2 to 50% by weight, still more preferably from 0.3 to 30% by weight, especially preferably from 0.3 to 10% by weight, of the polishing liquid composition 3-2, from the viewpoint of obtaining a polishing speed at a practical level by rapid oxidation of the metal layer.

The amount of water formulated is preferably from 39.88 to 99.88% by weight, more preferably from 60 to 99.4% by weight, still more preferably from 75 to 99% by weight, of the polishing liquid composition 3-2. The pH of the polishing liquid composition 3-2 having the above composition, which is the same as the polishing liquid composition 1-2, is preferably 10 or less, more preferably from 2 to 9.5, still more preferably from 4 to 9, especially preferably from 7 to 9, from the viewpoints of keeping the polishing speed at a practical level, suppressing the dishing, and removing the fine scratch damages on the surface. In order to adjust the pH within the above ranges, an inorganic acid such as nitric acid or sulfuric acid, an organic acid, a basic substance such as potassium hydroxide, sodium hydroxide, ammonia, or an organic amine can be appropriately added, as occasion demands.

In addition, when the polishing liquid composition 3 is prepared from the polishing liquid composition 1-3 (hereinafter referred to as "polishing liquid composition 3-3"), the amount of the amine compound and/or salts thereof formulated is preferably from 0.01 to 30% by weight, more preferably from 0.02 to 10% by weight, still more preferably from 0.03 to 5% by weight, of the polishing liquid composition 3-3, from the viewpoints of maintaining the polishing speed and suppressing the dishing.

The amount of the etching agent formulated in the polishing liquid composition 3-3 can be variously selected in order to secure a polishing speed at a practical level for removal of the metal layer, and to prevent excessive etching of the metal layer. The amount formulated is, for instance, preferably from 0.1 to 10% by weight, more preferably from 0.2 to 8% by weight, still more preferably from 0.3 to 5% by weight, of the polishing liquid composition 3-3.

The amount of the oxidizing agent formulated is preferably from 0.1 to 60% by weight, more preferably from 0.2 to 50% by weight, still more preferably from 0.3 to 30% by weight, especially preferably from 0.3 to 10% by weight, of the polishing liquid composition 3-3, from the viewpoint of obtaining a polishing speed at a practical level by rapid oxidation of the metal layer.

The amount of water formulated is preferably from 39.88 to 99.88% by weight, more preferably from 60 to 99.4% by weight, still more preferably from 75 to 99% by weight, of the polishing liquid composition 3-3. The pH of the polishing liquid composition 3-3 having the above composition, which is the same as the polishing liquid composition 1-3, is preferably 10 or less, more preferably from 2 to 9.5, still more preferably from 4 to 9, especially preferably from 5 to 9, from the viewpoints of keeping the polishing speed at a practical level, suppressing the dishing, and removing the fine scratch damages on the surface.

The polishing liquid compositions 1 to 3 of the present invention can be prepared in any manner without particular limitations, and for instance, a polishing liquid composition can be obtained by appropriately mixing each of the above components, and adjusting a pH. Concrete examples thereof are as follows.

The polishing liquid composition 1 of the present invention can be, for instance, prepared by the following procedures. First, an organic acid and/or an etching agent is added to a given amount of water, and a pH is adjusted to a given value. To the pH-adjusted aqueous solution of the organic acid and/or etching agent is added a given amount of an aqueous solution of a hydroxyl group-containing compound; or an aqueous solution of an aliphatic carboxylic acid having 7 to 24 carbon atoms and/or salts thereof, or an amine compound and/or salts thereof, the aqueous solution of which pH is adjusted to a given level. A pH is finally adjusted, whereby a polishing liquid composition 1 can be obtained.

The polishing liquid composition 2 can be, for instance, prepared by the following procedures. First, an organic acid and/or an etching agent is added to a given amount of water, and a pH is adjusted to a given value. To the pH-adjusted aqueous solution of the organic acid and/or etching agent is added a given amount of an aqueous solution of a hydroxyl group-containing compound; or an aqueous solution of an aliphatic carboxylic acid having 7 to 24 carbon atoms and/or salts thereof, or an amine compound and/or salts thereof, the aqueous solution of which pH is adjusted to a given level. An oxidizing agent is added before polishing, and a pH is finally adjusted, whereby a polishing liquid composition 2 can be obtained.

The polishing liquid composition 3 can be, for instance, prepared by the following procedures. First, an organic acid and/or an etching agent is added to a given amount of water, and a pH is adjusted to a given value. To the pH-adjusted aqueous solution of the organic acid and/or etching agent is added a given amount of an abrasive, and the mixture is sufficiently stirred so as to uniformly disperse the abrasives. Further, to the dispersion is added a given amount of an aqueous solution of a hydroxyl group-containing compound; or an aqueous solution of an aliphatic carboxylic acid having 7 to 24 carbon atoms and/or salts thereof, or an amine compound and/or salts thereof, the aqueous solution of which pH is adjusted to a given level. A given amount of an oxidizing agent is added before polishing as occasion demands, and a pH is finally adjusted, whereby a polishing liquid composition 3 can be obtained.

In addition, various polishing aids other than those listed above such as surfactants and dispersion stabilizers may be added to each of the polishing liquid compositions 1 to 3.

The polishing liquid composition of the present invention can be suitably used for the metal CMP in which a surface comprising an insulating layer and a metal layer is subject to polishing. The metal constituting the metal layer includes copper or copper alloys, aluminum or aluminum alloys, tungsten, and the like. Among these metals, especially when used for a process for forming embedded metal interconnection on a semiconductor substrate, copper or copper alloys are preferable. When the polishing liquid composition of the present invention is used in the formation of the metal interconnection layer made of copper or copper alloys, there are exhibited remarkable effects of maintaining the polishing speed and suppressing the dishing of the embedded metal interconnection layer. In addition, the material for forming the insulating layer may be any of organic or inorganic materials, and includes inorganic materials such as silicon dioxide, fluorinated silicon dioxide, hydrogen-containing SOG (spin-on glass), nitrides, such as tantalum nitride and titanium nitride; and organic materials such as organic SOG, polyimides, fluorinated polyimides, methyl polysiloxanes, aromatic polyethers, hydrogensilsesquioxane, and fluorocarbons.

The shape of these substrates to be polished is preferably those having a shape of forming recesses of an interconnection shape on the insulating film surface of the semiconductor substrate, and sedimenting metals on the insulating film including the recesses. In addition, there may be provided a barrier film made of tantalum, titanium, or a nitride thereof between the insulating film and the metal layer. Especially when the metal layer is made of copper or copper alloys, it is preferable to provide the barrier film, whereby the diffusion of the copper to the insulating layer can be prevented.

The polishing liquid compositions 1 and 2 of the present invention are effective for a polishing processes using a fixed grinding wheel, a polishing pad in which abrasive grains are fixed to the pad, and the like. The polishing liquid composition 3 is effective for a polishing process by loose abrasives using a usual polishing pad made of urethane, and it is also effective for a polishing processes using a fixed grinding wheel, a polishing pad in which abrasive grains are fixed to the pad, and the like.

The process for polishing a surface to be polished comprising an insulating layer and a metal layer of the present invention comprises polishing a semiconductor substrate using the polishing liquid composition of the present invention, thereby smoothening the polished surface.

In addition, the process for manufacturing a semiconductor substrate of the present invention comprises polishing a semiconductor surface comprising an insulating layer and a metal layer using the polishing liquid composition of the present invention, whereby the polishing speed of the metal layer can be maintained and the dishing of the embedded metal interconnection layer can be suppressed. Therefore, the process can be suitably applied to a process for manufacturing the semiconductor substrate.

EXAMPLES I-1 TO I-14 AND COMPARATIVE EXAMPLES I-1 TO I-4

Compounds having a structure in which each of two or more adjacent carbon atoms has hydroxyl group in a molecule (hydroxyl group-containing compound) used in Examples I-1 to I-14 are shown in Table 1. The hydroxyl group-containing compound shown in Table 1, the organic acid shown in Table 2, and hydrogen peroxide were mixed so as to have the proportion shown in Table 2. Further, 5% by weight portion of an abrasive shown in Table 2 and balance water were mixed with stirring, and thereafter a pH of the liquid mixture was adjusted to 4.0, to give a polishing liquid composition. Incidentally, each of the used abrasives was fumed silica (primary particle size: 50 nm) and colloidal silica (primary particle size: 30 nm). In addition, each of the hydroxyl group-containing compounds "a" to "e" of Table 1 dissolves in water at 1.0% by weight or more. The substrate to be polished was polished under the following conditions by single-sided polishing machine. Hereinbelow, the terms inside quotation marks are trade names.

Setting Conditions of Single-Sided Processing Machine
Single-sided processing machine used: single-sided polishing machine (disc size: 30 cm), manufactured by Engis.
Processing pressure: 29.4×10³ Pa
Polishing Pad: upper layer: "IC1000" (manufactured by Rodel Nitta K.K.); and lower layer: "SUBA400" (manufactured by Rodel Nitta K.K.).
Disc rotational speed: 60 rpm
Work rotational speed: 50 rpm (rotating disc and work in the same direction)
Feeding flow rate for a polishing liquid composition: 100 ml/min
Polishing time period: 10 minutes In addition, the properties of the polishing liquid composition such as relative polishing speed, relative etching speed, and dishing of the surface to be polished were evaluated in accordance with the following methods. The results thereof are shown in Table 2.

Relative Polishing Speed

The relative polishing speed is a value obtained by dividing the polishing speed of a polishing liquid composition by a polishing speed of a comparative example where the kinds and the amounts of an abrasive, an oxidizing agent and an etching agent were the same as the polishing liquid composition. The polishing speed was obtained by polishing a rolled copper plate of a diameter of 50 mm and a plate thickness of 1 mm, determining a change in the thickness before and after polishing, and dividing the resultant value by a polishing time. Incidentally, the thickness of the copper plate was measured by using a high-precision digital analyzer "MINIAX" commercially available from K. K. Tokyo Seimitsu. Here, each of the relative polishing speeds for Examples I-1 to I-5 and I-9 to I-10 was calculated based on Comparative Example I-1; each of the relative polishing speeds for Examples I-6 to I-8 was calculated based on Comparative Example I-2; and each of the relative polishing speeds for Examples I-13 to I-14 was calculated based on Comparative Example I-3. Incidentally, apart from the above, the relative polishing speed for Examples I-11 was calculated based on Comparative Example I-1; the relative polishing speed for Examples I-12 was calculated based on Comparative Example I-2; and the relative polishing speed for Comparative Example I-4 was calculated based on Comparative Example I-1.

Relative Etching Speed

The relative etching speed is a value obtained by dividing an etching speed of the polishing liquid composition comprising the above hydroxyl group-containing compound by an etching speed "b" of a polishing liquid composition not containing the above hydroxyl group-containing compound but having the same kinds and the amounts of an abrasive, an oxidizing agent and an etching agent as the polishing liquid composition. Here, each of the relative etching speeds for Examples I-1 to I-5 and I-9 to I-10 was calculated based on Comparative Example I-1; each of the relative etching speeds for Examples I-6 to I-8 was calculated based on Comparative Example I-2; and each of the relative etching speeds for Examples I-13 to I-14 was calculated based on Comparative Example I-3. Incidentally, apart from the above, the relative etching speed for Examples I-11 was calculated based on Comparative Example I-1; the relative etching speed for Examples I-12 was calculated based on Comparative Example I-2; and the relative etching speed for Comparative Example I-4 was calculated based on Comparative Example I-1. Incidentally, each the etching speeds for each the polishing liquid compositions of Examples I-1 to I-14 and Comparative Example 1-4 was a value measured under the same conditions as the above etching test B described above, except for using these polishing liquid compositions.

Dishing

In order to evaluate dishing, a wafer chip of a square with a side of 20 mm was cut out from a wafer (commercially available from SKW, "SKW6-2", size: 200 mm) with copper damascene interconnection patterns. Five wafer chips were fixed on an adhesive plate made of ceramic. Thereafter, a copper film in the periphery of the copper interconnection portion, the interconnection of which had a width of 150 μm, was removed, with confirming the state under the above conditions. The substrate was polished to a point where a barrier film appeared, and was further polished with 20% of a time period required for polishing until this point, to provide a sample for evaluating dishing. The dishing was evaluated by determining a cross section profile of a copper interconnection portion, the interconnection of which had a width of 150 μm by a surface roughness tester (commercially available from (K. Mitsutoyo, "SV-600"). Incidentally, when there were no recesses having sizes of 0.15 μm or more in the cross section profile of the copper interconnection tested, it was evaluated as absence of dishing, and when there were recesses having sizes of 0.15 μm or more, it was evaluated as presence of dishing, which are respectively denoted in Table 2 as "absence" or "presence."

Here, the etching speed "b" of the polishing liquid compositions used for Comparative Examples I-1 to I-3 were as follows.
Comparative Example I-1: 80 Å/min
Comparative Example I-2: 80 Å/min
Comparative Example I-3: 200 Å/min

TABLE 1

| No. | Hydroxyl Group-Containing Compound |
|---|---|
| a | n-C$_4$H$_9$CH(OH)CH$_2$OH |
| b | n-C$_4$H$_9$OCH$_2$CH(OH)CH$_2$OH |
| c | n-C$_6$H$_{13}$COOCH$_2$CH(OH)CH$_2$OH |
| d | (n-C$_3$H$_7$)$_2$NCH$_2$CH(OH)CH$_2$OH |
| e | n-C$_3$H$_7$OCOCH(OH)CH(OH)COO-n-C$_3$H$_7$ |

TABLE 2

| Ex. No. | Hydroxyl Group-Containing Compound Kind | Content (% by wt.) | Organic Acid Kind | Content (% by wt.) | Hydrogen Peroxide Content (% by wt.) | Abrasive Kind |
|---|---|---|---|---|---|---|
| I-1 | a | 1.0 | Gluconic acid | 2.0 | 2.0 | Fumed Silica |
| I-2 | b | 1.0 | Gluconic acid | 2.0 | 2.0 | Fumed Silica |

TABLE 2-continued

| | | | | | | |
|---|---|---|---|---|---|---|
| I-3 | c | 1.0 | Gluconic acid | 2.0 | 2.0 | Fumed Silica |
| I-4 | d | 1.0 | Gluconic acid | 2.0 | 2.0 | Fumed Silica |
| I-5 | e | 1.0 | Gluconic acid | 2.0 | 2.0 | Fumed Silica |
| I-6 | a | 1.0 | Gluconic acid | 2.0 | 2.0 | Colloidal Silica |
| I-7 | b | 1.0 | Gluconic acid | 2.0 | 2.0 | Colloidal Silica |
| I-8 | c | 1.0 | Gluconic acid | 2.0 | 2.0 | Colloidal Silica |
| I-9 | a | 0.5 | Gluconic acid | 2.0 | 2.0 | Fumed Silica |
| I-10 | a | 2.0 | Gluconic acid | 2.0 | 2.0 | Fumed Silica |
| I-11 | b | 1.0 | — | — | 2.0 | Fumed Silica |
| I-12 | b | 1.0 | Gluconic acid | 2.0 | — | Colloidal Silica |
| I-13 | a | 1.0 | Glycolic acid | 2.0 | 2.0 | Colloidal Silica |
| I-14 | b | 1.0 | Glycolic acid | 2.0 | 2.0 | Colloidal Silica |
| Comp. Ex. No. | | | | | | |
| I-1 | — | — | Gluconic acid | 2.0 | 2.0 | Fumed Silica |
| I-2 | — | — | Gluconic acid | 2.0 | 2.0 | Colloidal Silica |
| I-3 | — | — | Glycolic acid | 2.0 | 2.0 | Colloidal Silica |
| I-4 | Benzotriazole | 1.0 | Gluconic acid | 2.0 | 2.0 | Fumed Silica |

| | Evaluation of Properties | | | | | | |
|---|---|---|---|---|---|---|---|
| | Relative Polishing Speed | | | Relative Etching Speed | | | |
| | Based on C. Ex. I-1 | Based on C. Ex. I-2 | Based on C. Ex. I-3 | Based on C. Ex. I-1 | Based on C. Ex. I-2 | Based on C. Ex. I-3 | Dishing |
| Ex. No. | | | | | | | |
| I-1 | 1.0 | — | — | 0.1 or less | — | — | Absence |
| I-2 | 1.0 | — | — | 0.1 or less | — | — | Absence |
| I-3 | 1.0 | — | — | 0.15 | — | — | Absence |
| I-4 | 1.1 | — | — | 0.15 | — | — | Absence |
| I-5 | 1.1 | — | — | 0.2 | — | — | Absence |
| I-6 | — | 1.0 | — | — | 0.1 or less | — | Absence |
| I-7 | — | 1.0 | — | — | 0.1 or less | — | Absence |
| I-8 | — | 1.1 | — | — | 0.15 | — | Absence |
| I-9 | 1.1 | — | — | 0.1 or less | — | — | Absence |
| I-10 | 1.0 | — | — | 0.1 or less | — | — | Absence |
| I-11 | 0.7 | — | — | 0.1 or less | — | — | Absence |
| I-12 | — | 0.7 | — | — | 0.1 or less | — | Absence |
| I-13 | — | — | 0.9 | — | — | 0.1 or less | Absence |
| I-14 | — | — | 0.9 | — | — | 0.1 or less | Absence |
| Comp. Ex. No. | | | | | | | |
| I-1 | 1.0 | — | — | 1.0 | — | — | Presence |
| I-2 | — | 1.0 | — | — | 1.0 | — | Presence |

TABLE 2-continued

| | | | | | | | |
|---|---|---|---|---|---|---|---|
| I-3 | — | — | 1.0 | — | — | 1.0 | Presence |
| I-4 | 0.1 | — | — | 0.1 or less | — | — | * |

Note
* The polishing speed was too slow to be evaluated.

It is found from the results of Tables 1 and 2 that all of the polishing liquid compositions of Examples I-1 to I-14 where the hydroxyl group-containing compound is formulated in the polishing liquid composition suppressed the etching speed and the dishing is not generated without substantially lowering the polishing speed, as compared to the polishing liquid compositions of Comparative Examples I-1 to I-3 where the hydroxyl group-containing compound is not formulated.

In addition, it is found that the polishing liquid composition of Comparative Example I-4 where benzotriazole acting to suppressing etching was used in place of the hydroxyl group-containing compound, the polishing speed is extremely low.

Also, it is found that by using the hydroxyl group-containing compound, the etching agent, and the oxidizing agent, a higher polishing speed can be realized, and the dishing can be prevented.

EXAMPLES II-1 TO II-12 AND COMPARATIVE EXAMPLES II-1 TO II-12

Each of the etching agents shown in Tables 3 and 4, and hydrogen peroxide were mixed with a given amount of water, so as to have the proportion shown in Tables 3 and 4. Further, 5% by weight portion of the abrasive shown in Tables 3 and 4 were mixed with stirring, and thereafter an aqueous ammonia was added so as to have a pH of the liquid mixture of 7.5 to 8. Separately from above, an aqueous ammonia was previously added to an aliphatic carboxylic acid having 7 to 24 carbon atoms to adjust the pH to 7.5 to 8, whereby preparing an aqueous solution of the aliphatic carboxylic acid or its salt. The aqueous solution of the aliphatic carboxylic acid or its salt was mixed with the above liquid mixture with stirring, so as to have the proportion shown in Tables 3 and 4. Thereafter, a pH of the liquid mixture was adjusted to a value shown in Tables 3 and 4, to give each polishing liquid composition. Incidentally, each of the used abrasives was fumed silica (primary particle size: 50 nm) and colloidal silica (primary particle size: 100 nm). In addition, a rolled copper plate of a diameter of 50 mm and a plate thickness of 1 mm was polished under the same conditions as above by single-sided polishing machine.

In addition, the properties of the polishing liquid composition such as relative polishing speed, relative etching speed, dishing of the surface to be polished, and surface condition of copper were evaluated in accordance with the following methods. The results thereof are shown in Tables 3 and 4.

Relative Polishing Speed

The relative polishing speed is a value obtained by dividing the polishing speed of a polishing liquid composition by a polishing speed of a comparative example where the kinds and the amounts of an abrasive, an oxidizing agent and an etching agent were the same as the polishing liquid composition. The polishing speed was obtained by polishing a rolled copper plate of a diameter of 50 mm and a plate thickness of 1 mm under the polishing conditions mentioned above, determining a change in the thickness before and after polishing, and dividing the resultant value by a polishing time. Incidentally, the thickness of the copper plate was measured by using a high-precision digital analyzer "MINIAX" commercially available from K. K. Tokyo Seimitsu. Here, each of the relative polishing speeds for Examples II-1 to II-6 was calculated based on Comparative Example II-1; the relative polishing speed for Example II-7 was calculated based on Comparative Example II-2; the relative polishing speed for Example II-8 was calculated based on Comparative Example II-3; the relative polishing speed for Example II-9 was calculated based on Comparative Example II-4; the relative polishing speed for Example II-10 was calculated based on Comparative Example II-5; the relative polishing speed for Example II-11 was calculated based on Comparative Example II-11; the relative polishing speed for Example II-12 was calculated based on Comparative Example II-12; the relative polishing speed for Comparative Example II-9 was calculated based on Comparative Example II-1; and the relative polishing speed for Comparative Example II-10 was calculated based on Comparative Example II-2. Incidentally, apart from the above, each of the relative polishing speeds for Comparative Examples II-6 to II-8 was calculated based on Comparative Example II-1.

Relative Etching Speed

The relative etching speed is a value obtained by dividing an etching speed of the polishing liquid composition comprising the above aliphatic carboxylic acid and/or its salt by an etching speed "c" of a polishing liquid composition not containing the above aliphatic carboxylic acid and/or its salt but having the same kinds and the amounts of an abrasive, an oxidizing agent and an etching agent as the polishing liquid composition. Here, each of the relative etching speeds for Examples II-1 to II-6 was calculated based on Comparative Example II-1; the relative etching speed for Example II-7 was calculated based on Comparative Example II-2; the relative etching speed for Example. II-8 was calculated based on Comparative Example II-3; the relative etching speed for Example II-9 was calculated based on Comparative Example II-4; the relative etching speed for Example II-10 was calculated based on Comparative Example II-5; the relative etching speed for Example II-11 was calculated based on Comparative Example II-11; the relative etching speed for Example II-12 was calculated based on Comparative Example II-12; the relative etching speed for Comparative Example II-9 was calculated based on Comparative Example II-1; and the relative etching speed for Comparative Example II-10 was calculated based on Comparative Example II-2. Incidentally, apart from the above, each of the relative etching speeds for Comparative Examples II-6 to II-8 was calculated based on Comparative Example II-1. Incidentally, each the etching speeds for each the polishing liquid compositions of Examples II-1 to II-12 and Comparative Examples II-7 to II-8 was a value measured under the same conditions as the above etching test C described above, except for using these polishing liquid compositions.

Dishing

Dishing was evaluated in the same manner as above. Incidentally, when there were no recesses having sizes of 0.15 μm or more in the cross section profile of the copper interconnection tested, it was evaluated as absence of dishing, and when there were recesses having sizes of 0.15 μm or more, it was evaluated as presence of dishing, which are respectively denoted in Tables 3 and 4 as "absence" or "presence."

Copper Surface Condition

The surface condition of the copper film at the copper interconnection portion, the interconnection of which has a width of 150 μm on the surface of wafer chip used in the evaluation of the dishing was observed by optical microscope, to confirm the presence or absence of roughening.

Here, the etching speed "c" of the polishing liquid compositions used for Comparative Examples II-1 to II-6 were as follows.
Comparative Example II-1: 50 Å/min
Comparative Example II-2: 100 Å/min
Comparative Example II-3: 200 Å/min
Comparative Example II-4: 600 Å/min
Comparative Example II-5: 50 Å/min
Comparative Example II-6: 100 Å/min

TABLE 3

| Ex. No. | Aliphatic Carboxylic Acid and/or Its Salt | | Etching Agent | | Hydrogen Peroxide | Abrasive | pH |
|---|---|---|---|---|---|---|---|
| | Kind | Content | Kind | Content | Content | Kind | |
| II-1 | Octanoic acid | 0.6[1)] | Glycolic acid | 2.0[1)] | 4.0[1)] | Colloidal Silica | 7.6 |
| II-2 | Nonanoic acid | 0.3 | Glycolic acid | 2.0 | 4.0 | Colloidal Silica | 7.7 |
| II-3 | Heptanoic acid | 1.2 | Glycolic acid | 2.0 | 4.0 | Colloidal Silica | 7.6 |
| II-4 | Decanoic acid | 0.3 | Glycolic acid | 2.0 | 4.0 | Colloidal Silica | 7.7 |
| II-5 | Oleic acid | 0.3 | Glycolic acid | 2.0 | 4.0 | Colloidal Silica | 8.0 |
| II-6 | Isooctanoic acid[2)] | 1.5 | Glycolic acid | 2.0 | 4.0 | Colloidal Silica | 7.7 |
| II-7 | Octanoic acid | 1.2 | Citric acid | 2.0 | 2.0 | Fumed Silica | 7.6 |
| II-8 | Octanoic acid | 1.0 | Phthalic acid | 2.0 | 2.0 | Fumed Silica | 7.9 |
| II-9 | Octanoic acid | 1.5 | Aminotri-(methylene-phosphonic acid) | 2.0 | 2.0 | Fumed Silica | 7.6 |
| II-10 | Octanoic acid | 0.4 | Glycolic acid | 2.0 | — | Colloidal Silica | 7.6 |
| II-11 | Octanoic acid | 1.0 | Hydrochloric acid | 2.0 | 2.0 | Colloidal Silica | 7.7 |
| II-12 | Octanoic acid | 0.5 | Sulfuric acid | 2.0 | 2.0 | Colloidal Silica | 7.9 |

| Ex. No. | Evaluation for Properties | | | | |
|---|---|---|---|---|---|
| | Relative Polishing Speed | Relative Etching Speed | Comp. Ex. To Which Evaluation Was Based | Dishing | Copper Surface Condition |
| II-1 | 1.0 | 0.1 or less | Comp. Ex. II-1 | Absence | No Roughening |
| II-2 | 1.0 | 0.1 or less | Comp. Ex. II-1 | Absence | No Roughening |
| II-3 | 1.0 | 0.1 or less | Comp. Ex. II-1 | Absence | No Roughening |
| II-4 | 0.9 | 0.1 or less | Comp. Ex. II-1 | Absence | No Roughening |
| II-5 | 0.9 | 0.1 or less | Comp. Ex. II-1 | Absence | No Roughening |
| II-6 | 1.0 | 0.1 or less | Comp. Ex. II-1 | Absence | No Roughening |
| II-7 | 1.0 | 0.1 or less | Comp. Ex. II-2 | Absence | No Roughening |
| II-8 | 0.9 | 0.1 or less | Comp. Ex. II-3 | Absence | No Roughening |
| II-9 | 0.9 | 0.1 or less | Comp. Ex. II-4 | Absence | No Roughening |
| II-10 | 0.9 | 0.1 or less | Comp. Ex. II-5 | Absence | No Roughening |

TABLE 3-continued

| | | | | | |
|---|---|---|---|---|---|
| II-11 | 0.9 | 0.1 or less | Comp. Ex. II-11 | Absence | No Roughening |
| II-12 | 0.9 | 0.1 or less | Comp. Ex. II-12 | Absence | No Roughening |

Note
[1] % by weight
[2] Secanoic C8 acid (trade name, commercially available from Exon Chemicals K.K.)

TABLE 4

| Comp. Ex. No. | Aliphatic Carboxylic Acid and/or Its Salt | | Etching Agent | | Hydrogen Peroxide | Abrasive | |
|---|---|---|---|---|---|---|---|
| | Kind | Content | Kind | Content | Content | Kind | pH |
| II-1 | — | — | Glycolic acid | 2.0[1] | 4.0[1] | Colloidal Silica | 7.6 |
| II-2 | — | — | Citric acid | 2.0 | 2.0 | Fumed Silica | 7.6 |
| II-3 | — | — | Phthalic acid | 2.0 | 2.0 | Fumed Silica | 7.9 |
| II-4 | — | — | Aminotri-(methylene-phosphonic acid) | 2.0 | 2.0 | Fumed Silica | 7.6 |
| II-5 | — | — | Glycolic acid | 2.0 | — | Colloidal Silica | 7.6 |
| II-6 | — | — | Glycolic acid Citric acid | 1.0 1.0 | 4.0 | Colloidal Silica | 7.6 |
| II-7 | Octanoic acid Heptanoic acid | 0.5[1] 0.5 | — | — | 4.0 | Colloidal Silica | 7.8 |
| II-8 | Oleic acid | 0.5 | — | — | 4.0 | Colloidal Silica | 7.6 |
| II-9 | Benzotriazole | 0.3 | Glycolic acid | 2.0 | 4.0 | Colloidal Silica | 7.6 |
| II-10 | Ammonium Polyacrylate | 1.0 | Citric acid | 2.0 | 2.0 | Fumed Silica | 7.6 |
| II-11 | — | — | Hydrochloric acid | 2.0 | 2.0 | Colloidal Silica | 7.7 |
| II-12 | — | — | Sulfuric acid | 2.0 | 2.0 | Colloidal Silica | 7.9 |

| Comp. Ex. No. | Evaluation for Properties | | | | |
|---|---|---|---|---|---|
| | Relative Polishing Speed | Relative Etching Speed | Comp. Ex. To Which Evaluation Was Based | Dishing | Copper Surface Condition |
| II-1 | 1.0 | 1.0 | — | Presence | No Roughening |
| II-2 | 1.0 | 1.0 | — | Presence | No Roughening |
| II-3 | 1.0 | 1.0 | — | Presence | No Roughening |
| II-4 | 1.0 | 1.0 | — | Presence | No Roughening |
| II-5 | 1.0 | 1.0 | — | Presence | No. Roughening |
| II-6 | 1.3 | 1.5 | Comp. Ex. II-1 | Presence | No Roughening |
| II-7 | 0.1 or less | 0.1 or less | Comp. Ex. II-1 | The polishing speed was too slow to be evaluated. | |
| II-8 | 0.1 or less | 0.1 or less | Comp. Ex. II-1 | | |
| II-9 | 0.1 or less | 0.1 or less | Comp. Ex. II-1 | | |
| II-10 | 1.2 | 0.1 or less | Comp. Ex. II-2 | Absence | Presence of Roughening |
| II-11 | 1.0 | 1.0 | — | Presence | No Roughening |
| II-12 | 1.0 | 1.0 | — | Presence | No Roughening |

Note
[1] % by weight

It is found from the results of Tables 3 and 4 that all of the polishing liquid compositions of Examples II-1 to II-12 where the aliphatic carboxylic acid having 7 to 24 carbon atoms is formulated in the polishing liquid composition suppressed the etching speed and the dishing is not generated without substantially lowering the polishing speed, as compared to the polishing liquid compositions of Comparative Examples II-1 to II-5, II-11 and II-12 where the aliphatic carboxylic acid is not formulated.

In addition, the polishing liquid composition of Comparative Example II-6 where two kinds of aliphatic carboxylic acids having 6 or less carbon atoms are used in combination without using the aliphatic carboxylic acid having 7 to 24 carbon atoms has high etching speed and the dishing generated.

In addition, it is found that all of the polishing liquid composition of Comparative Example II-7 where two kinds of the aliphatic carboxylic acids having 7 to 24 carbon atoms are used in combination; the polishing liquid composition of Comparative Example II-8 where the organic acid capable of forming an aqueous salt with copper is not formulated; and the polishing liquid composition of Comparative Example II-9 where benzotriazole for suppressing etching is formulated have extremely low polishing speeds, and that the polishing liquid composition of Comparative Example II-10 where ammonium polyacrylate is formulated has copper surface with roughening generated.

Therefore, an even higher polishing speed can be realized by using the aliphatic carboxylic acid having 7 to 24 carbon atoms in combination with an etching agent, and the dishing can be prevented.

Especially, from the viewpoint of keeping the low-foamability during polishing, it is more preferable that the aliphatic carboxylic acid having 7 to 24 carbon atoms is heptanoic acid, octanoic acid and nonanoic acid.

EXAMPLES III-1 TO III-8 AND COMPARATIVE EXAMPLES III-1 TO III-5

Each of the etching agents shown in Table 5, and the amine compound were mixed with a given amount of water, so as to have the proportion shown in Table 5, and thereafter an aqueous ammonia was added so as to have a pH of the liquid mixture of 6 to 8. Further, hydrogen peroxide was added so as to have a proportion shown in Table 5. Further, 5% by weight portion of an abrasive shown in Table 5 was mixed with stirring, and thereafter a pH of the liquid mixture was adjusted to the value shown in Table 5, to give a polishing liquid composition. Incidentally, each of the used abrasives was fumed silica (primary particle size: 50 nm) and colloidal silica (primary particle size: 100 nm). In addition, a rolled copper plate of a diameter of 50 mm and a plate thickness of 1 mm was polished under the same conditions as above by single-sided polishing machine.

In addition, the properties of the polishing liquid composition such as relative polishing speed, relative etching speed, and dishing of the surface to be polished were evaluated in accordance with the following methods. The results thereof are shown in Table 5.

Relative Polishing Speed

The relative polishing speed is a value obtained by dividing the polishing speed of a polishing liquid composition by a polishing speed of a comparative example where the kinds and the amounts of an abrasive, an oxidizing agent and an etching agent were the same as the polishing liquid composition. The polishing speed was obtained by polishing a rolled copper plate of a diameter of 50 mm and a plate thickness of 1 mm, determining a change in the thickness before and after polishing, and dividing the resultant value by a polishing time. Incidentally, the thickness of the copper plate was measured by using a high-precision digital analyzer "MINIAX" commercially available from K. K. Tokyo Seimitsu. Here, each of the relative polishing speeds for Examples III-1, III-2, III-4, III-5, and III-7 was calculated based on Comparative Example III-1; the relative polishing speed for Example III-6 was calculated based on Comparative Example III-2; the relative polishing speed for Example III-3 was calculated based on Comparative Example III-3; and the relative polishing speed for Example III-8 was calculated based on Comparative Example III-4. Incidentally, apart from the above, the relative polishing speed for Comparative Example III-5 was calculated based on Comparative Example III-1.

Relative Etching Speed

The relative etching speed is a value obtained by dividing an etching speed of the polishing liquid composition comprising the above amine compound and/or its salt by an etching speed "c" of a polishing liquid composition not containing the above amine compound and/or its salt but having the same kinds and the amounts of an abrasive, an oxidizing agent and an etching agent as the polishing liquid composition. Here, each of the relative etching speeds for Examples III-1, III-2, III-4, III-5, and III-7 was calculated based on Comparative Example III-1; the relative etching speed for Example III-6 was calculated based on Comparative Example III-2; the relative etching speed for Example III-3 was calculated based on Comparative Example III-3; and the relative etching speed for Example III-8 was calculated based on Comparative Example III-4. Incidentally, apart from the above, the relative etching speed for Comparative Example III-5 was calculated based on Comparative Example III-1. Incidentally, each the etching speeds for each the polishing liquid compositions of Examples III-1 to III-8 and Comparative Example III-5 was a value measured under the same conditions as the above etching test C described above, except for using these polishing liquid compositions.

Dishing

Dishing was evaluated in the same manner as above. Incidentally, when there were no recesses having sizes of 0.15 μm or more in the cross section profile of the copper interconnection tested, it was evaluated as absence of dishing, and when there were recesses having sizes of 0.15 μm or more, it was evaluated as presence of dishing, which are respectively denoted in Table 5 as "absence" or "presence."

Here, the etching speed "c" of the polishing liquid compositions used for Comparative Examples III-1 to III-4 were as follows.

Comparative Example III-1: 50 Å/min
Comparative Example III-2: 100 Å/min
Comparative Example III-3: 50 Å/min
Comparative Example III-4: 50 Å/min

TABLE 5

| | Amine Compound | | Etching Agent | | Hydrogen Peroxide | | | |
|---|---|---|---|---|---|---|---|---|
| | Kind | Content (% by wt.) | Kind | Content (% by wt.) | Content (% by wt.) | Abrasive Kind | pH | |
| Ex. No. | | | | | | | | |
| III-1 | Octylamine | 0.8 | Glycolic acid | 2.0 | 4.0 | Colloidal Silica | 7.6 | |
| III-2 | Nonylamine | 0.5 | Glycolic acid | 2.0 | 4.0 | Colloidal Silica | 7.6 | |
| III-3 | Decylamine | 1.0 | Hydrochloric acid | 2.0 | 2.0 | Colloidal Silica | 7.7 | |
| III-4 | Oleylamine | 0.4 | Glycolic acid | 2.0 | 4.0 | Colloidal Silica | 7.6 | |
| III-5 | Dimethyl-dodecylamine | 0.5 | Glycolic acid | 2.0 | 4.0 | Colloidal Silica | 7.6 | |
| III-6 | Dimethyl-dodecylamine | 0.8 | Citric acid | 2.0 | 2.0 | Fumed Silica | 7.6 | |
| III-7 | Dodecyl-diethanolamine | 0.8 | Glycolic acid | 2.0 | 4.0 | Colloidal Silica | 7.6 | |
| III-8 | Octylamine | 0.5 | Glycolic acid | 2.0 | — | Colloidal Silica | 7.6 | |
| Comp. Ex. No. | | | | | | | | |
| III-1 | — | — | Glycolic acid | 2.0 | 4.0 | Colloidal Silica | 7.6 | |
| III-2 | — | — | Citric acid | 2.0 | 2.0 | Fumed Silica | 7.6 | |
| III-3 | — | — | Hydrochloric acid | 2.0 | 2.0 | Colloidal Silica | 7.7 | |
| III-4 | — | — | Glycolic acid | 2.0 | — | Colloidal Silica | 7.6 | |
| III-5 | Benzotriazole | 0.3 | Glycolic acid | 2.0 | 4.0 | Colloidal Silica | 7.6 | |

| | Evaluation for Properties | | | |
|---|---|---|---|---|
| | Relative Polishing Speed | Relative Etching Speed | Comp. Ex. To Which Evaluation Was Based | Dishing |
| Ex. No. | | | | |
| III-1 | 1.0 | 0.1 or less | Comp. Ex. III-1 | Absence |
| III-2 | 0.9 | 0.1 or less | Comp. Ex. III-1 | Absence |
| III-3 | 1.0 | 0.1 or less | Comp. Ex. III-3 | Absence |
| III-4 | 0.9 | 0.1 or less | Comp. Ex. III-1 | Absence |
| III-5 | 0.9 | 0.1 or less | Comp. Ex. III-1 | Absence |
| III-6 | 0.9 | 0.1 or less | Comp. Ex. III-2 | Absence |
| III-7 | 0.9 | 0.1 or less | Comp. Ex. III-1 | Absence |
| III-8 | 0.9 | 0.1 or less | Comp. Ex. III-4 | Absence |
| Comp. Ex. No. | | | | |
| III-1 | 1.0 | 1.0 | — | Presence |
| III-2 | 1.0 | 1.0 | — | Presence |
| III-3 | 1.0 | 1.0 | — | Presence |
| III-4 | 1.0 | 1.0 | — | Presence |
| III-5 | 0.1 or less | 0.1 or less | Comp. Ex. III-1 | * |

Note
*: The polishing speed was too slow to be evaluated.

It is found from the results of Table 5 that all of the polishing liquid compositions of Examples III-1 to III-8 where the amine compound is formulated in the polishing liquid composition suppressed the etching speed and the dishing is not generated without substantially lowering the polishing speed, as compared to the polishing liquid compositions of Comparative Examples III-1 to III-4 where the amine compound is not formulated.

In addition, it is found that the polishing liquid composition of Comparative Example III-5 where benzotriazole acting to suppressing etching was used in place of the amine compound, the polishing speed is extremely low.

Therefore, it is found that an even higher polishing speed can be realized by using the amine compound in combination with an etching agent, and the dishing can be prevented.

Especially, from the viewpoint of keeping the low-foamability during polishing, it is more preferable that the amine compound is heptylamine, octylamine and nonylamine.

Since the polishing liquid composition of the present invention is used for polishing a surface to be polished comprising an insulating layer and a metal layer, there are exhibited such effects that the polishing speed of the metal film is maintained, that the etching speed is suppressed, and defects such as dishing in the interconnection metal layer is not generated.

The invention claimed is:

1. A method comprising chemical mechanical polishing a surface comprising an insulating layer and a metal layer using a polishing liquid composition comprising an amine compound represented by the following general formula:

wherein
R$^3$ is a linear or branched alkyl group having 4 to 18 carbon atoms, or
a linear or branched alkenyl group having 4 to 18 carbon atoms, or
an aryl group having 6 to 18 carbon atoms, or
an aralkyl group having 7 to 18 carbon atoms;
each of R$^4$ and R$^5$, which may be identical or different, is
a linear alkyl group having 1 to 8 carbon atoms or
a branched alkyl group having 3 to 8 carbon atoms, or
a group represented by H—(OR$^6$)$_z$—wherein R$^6$ is a linear alkylene group having 1 to 3 carbon atoms, or
a branched alkylene group having 3 carbon atoms; and
Z is a number of 1 to 20, and/or a salt thereof,
an etching agent,
at least one of an oxidizing agent and an abrasive, and water.

2. The method according to claim 1, wherein the polishing liquid composition comprises the oxidizing agent.

3. The method according to claim 1, wherein the etching agent is at least one compound selected from the group consisting of
A: aliphatic organic acids having 6 or less carbon atoms and one to three carboxyl groups;
B: aromatic organic acids having 7 to 10 carbon atoms and one to four carboxyl groups;
C: organic acids having 6 or less carbon atoms and one to four phosphonic groups; and
D: polyaminocarboxylic acids having in a molecule two or more structures represented by the formula (III):

4. The method according to claim 3, wherein the etching agent is at least one compound selected from the group consisting of glycolic acid, gluconic acid, citric acid, and aminotri(methylene-phosphonic acid).

5. The method according to claim 1, wherein R$^3$ is a linear or branched, alkyl or alkenyl group having 5 to 14 carbon atoms.

6. The method according to claim 1, wherein the polishing liquid composition comprises the abrasive.

7. The method according to claim 3, wherein the etching agent comprises a compound from group A.

8. The method according to claim 3, wherein the etching agent comprises a compound from group B.

9. The method according to claim 3, wherein the etching agent comprises a compound from group C.

10. The method according to claim 3, wherein the etching agent comprises a compound from group D.

11. The method according to claim 1, wherein R$^3$ is a linear or branched, alkyl or alkenyl group having 7 to 10 carbon atoms, and R$^4$ and R$^5$ are independently a linear alkyl group having 1 or 2 carbon atoms or a group represented by H—(OR$^6$)$_z$—, wherein R$^6$ is an alkylene group having 2 carbon atoms, and Z is a number of 1 to 4.

12. The method according to claim 1, wherein the metal layer comprises a metal selected from the group consisting of copper, copper alloys, aluminum, aluminum alloys, and tungsten.

* * * * *

UNITED STATES PATENT AND TRADEMARK OFFICE
CERTIFICATE OF CORRECTION

PATENT NO. : 7,604,751 B2 Page 1 of 1
APPLICATION NO. : 11/434074
DATED : October 20, 2009
INVENTOR(S) : Yoneda et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 157 days.

Signed and Sealed this

Fourteenth Day of December, 2010

David J. Kappos
*Director of the United States Patent and Trademark Office*